United States Patent
Vail et al.

(10) Patent No.: US 6,922,278 B2
(45) Date of Patent: Jul. 26, 2005

(54) SWITCHED LASER ARRAY MODULATION WITH INTEGRAL ELECTROABSORPTION MODULATOR

(75) Inventors: Edward C. Vail, Fremont, CA (US); Gideon Yoffe, Palo Alto, CA (US); Bardia Pezeshki, Redwood City, CA (US); Mark Emanuel, Fremont, CA (US); John Heanue, Fremont, CA (US)

(73) Assignee: Santur Corporation, Fremont, CA (US)

( * ) Notice: Subject to any disclaimer, the term of this patent is extended or adjusted under 35 U.S.C. 154(b) by 0 days.

(21) Appl. No.: 10/114,894

(22) Filed: Apr. 1, 2002

(65) Prior Publication Data

US 2002/0183002 A1 Dec. 5, 2002

Related U.S. Application Data

(60) Provisional application No. 60/280,093, filed on Mar. 30, 2001.

(51) Int. Cl.$^7$ .......................... G02F 1/29; H04B 10/12; H01S 3/13
(52) U.S. Cl. ................. 359/320; 398/183; 372/29.01
(58) Field of Search .......................... 359/245, 248, 359/237, 238, 124, 133, 123, 247, 322, 316, 320; 385/1–3, 40, 42, 91, 95, 98, 183, 185; 372/9, 12, 29.01; 398/91, 95, 98, 183, 185

(56) References Cited

U.S. PATENT DOCUMENTS

| | | | |
|---|---|---|---|
| 4,009,385 A | 2/1977 | Sell | 372/38.07 |
| 4,317,611 A | 3/1982 | Petersen | 359/214 |
| 4,359,773 A | 11/1982 | Swartz et al. | 372/26 |
| 4,498,730 A | 2/1985 | Tanaka et al. | 385/18 |
| 4,725,131 A | 2/1988 | Goodwin et al. | 385/46 |
| 4,796,266 A | 1/1989 | Banwell et al. | 372/29.021 |
| 4,866,699 A | 9/1989 | Brackett et al. | 398/78 |
| 5,002,349 A | 3/1991 | Cheung et al. | 385/1 |
| 5,132,824 A | 7/1992 | Patel et al. | 349/1 |
| 5,136,598 A | 8/1992 | Weller et al. | 372/26 |
| 5,274,489 A | 12/1993 | Smith et al. | 359/211 |
| 5,283,796 A | 2/1994 | Fink | 372/32 |

(Continued)

FOREIGN PATENT DOCUMENTS

| | | |
|---|---|---|
| EP | 0924821 A1 | 6/1999 |
| FR | 2805092 | 8/2001 |
| JP | 56060088 | 5/1981 |
| JP | 11326707 | 11/1999 |
| JP | 2002246699 | 8/2002 |
| WO | WO 95/13638 | 5/1995 |
| WO | WO 02/13343 A2 | 2/2002 |
| WO | WO 02/37069 A1 | 5/2002 |
| WO | WO 02/37621 A2 | 5/2002 |
| WO | WO 02/058197 A2 | 7/2002 |
| WO | WO 02/013343 A3 | 7/2003 |

OTHER PUBLICATIONS

"Broadband Lightwave Sources and System", Gayton Photonics Ltd., http://www.infowin.org/ACTS/RUS/PROJECTS/ac065.htm, printed Oct. 17, 2000 (4 pages).

(Continued)

Primary Examiner—Georgia Epps
Assistant Examiner—William Choi
(74) Attorney, Agent, or Firm—Christie, Parker, & Hale LLP

(57) ABSTRACT

A photonic device including an array of lasers providing light to an array of electro-absorption modulators, both on a common substrate. In some embodiments the lasers are in a closely spaced array and lase at different wavelengths, providing with associated electro-absorption modulators a compact wavelength selectable laser.

27 Claims, 5 Drawing Sheets

U.S. PATENT DOCUMENTS

| | | | | |
|---|---|---|---|---|
| 5,289,485 | A | | 2/1994 | Mooradian ................... 372/45 |
| 5,291,502 | A | | 3/1994 | Pezeshki et al. .............. 372/20 |
| 5,305,338 | A | | 4/1994 | Wakata et al. ........... 372/38.03 |
| 5,378,330 | A | | 1/1995 | Li et al. ...................... 205/661 |
| 5,379,310 | A | | 1/1995 | Papen et al. .................. 372/23 |
| 5,383,216 | A | | 1/1995 | Takemi ........................ 372/50 |
| 5,394,489 | A | | 2/1995 | Koch .......................... 385/14 |
| 5,412,675 | A | | 5/1995 | Odagawa ............... 372/29.021 |
| 5,414,540 | A | | 5/1995 | Patel et al. .................. 349/196 |
| 5,420,416 | A | | 5/1995 | Iida et al. ............... 250/201.1 |
| 5,428,635 | A | | 6/1995 | Zhiglinsky et al. ........... 372/92 |
| 5,468,975 | A | | 11/1995 | Valster ........................ 257/97 |
| 5,491,576 | A | * | 2/1996 | Bergano ..................... 398/185 |
| 5,504,609 | A | | 4/1996 | Alexander et al. .......... 359/125 |
| 5,515,196 | A | | 5/1996 | Kitajima et al. ............ 359/180 |
| 5,519,487 | A | | 5/1996 | Atwood et al. ............. 356/73.1 |
| 5,524,076 | A | | 6/1996 | Rolland et al. ................ 385/8 |
| 5,526,171 | A | | 6/1996 | Warren ....................... 359/285 |
| 5,561,682 | A | * | 10/1996 | Aoki et al. .................... 372/50 |
| 5,612,968 | A | | 3/1997 | Zah ............................. 372/50 |
| 5,629,790 | A | | 5/1997 | Neukermans et al. ....... 359/198 |
| 5,631,735 | A | | 5/1997 | Nagai .......................... 356/330 |
| 5,682,262 | A | | 10/1997 | Wefers et al. ................ 359/305 |
| 5,706,117 | A | | 1/1998 | Imai et al. ................... 359/187 |
| 5,715,047 | A | | 2/1998 | Adamovsky ................. 356/128 |
| 5,719,650 | A | | 2/1998 | Wefers et al. ................. 349/74 |
| 5,771,253 | A | | 6/1998 | Chang-Hasnain et al. .... 372/20 |
| 5,777,763 | A | | 7/1998 | Tomlinson, III ............ 359/130 |
| 5,784,183 | A | | 7/1998 | Aoki et al. .................... 398/91 |
| 5,784,507 | A | | 7/1998 | Holm-Kennedy et al. .... 385/31 |
| 5,798,859 | A | | 8/1998 | Colbourne et al. .......... 359/247 |
| 5,825,792 | A | | 10/1998 | Villeneuve et al. ........... 372/32 |
| 5,870,512 | A | | 2/1999 | Koch et al. .................... 385/14 |
| 5,882,468 | A | | 3/1999 | Crockett et al. .......... 156/345.3 |
| 5,930,045 | A | | 7/1999 | Shirasaki ..................... 359/577 |
| 5,949,544 | A | | 9/1999 | Manning ..................... 356/452 |
| 5,953,359 | A | | 9/1999 | Yamaguchi et al. .......... 372/50 |
| 5,959,750 | A | | 9/1999 | Eskildsen et al. ............. 398/92 |
| 5,977,567 | A | | 11/1999 | Verdiell ........................ 257/99 |
| 5,978,402 | A | | 11/1999 | Matsumoto et al. .......... 372/50 |
| 5,987,044 | A | | 11/1999 | Odagawa et al. ........ 372/38.02 |
| 5,993,544 | A | * | 11/1999 | Knauss et al. ................ 117/94 |
| 5,999,303 | A | | 12/1999 | Drake ......................... 359/224 |
| 5,999,545 | A | | 12/1999 | Jeon et al. ....................... 372/6 |
| 6,044,705 | A | | 4/2000 | Neukermans et al. .... 73/504.02 |
| 6,049,554 | A | | 4/2000 | Lang et al. .................... 372/20 |
| 6,078,394 | A | | 6/2000 | Wood .......................... 356/454 |
| 6,091,537 | A | | 7/2000 | Sun et al. .................... 359/248 |
| 6,133,615 | A | | 10/2000 | Guckel et al. ............... 257/446 |
| 6,150,667 | A | | 11/2000 | Ishizaka et al. ............... 257/21 |
| 6,172,781 | B1 | | 1/2001 | Doerr ......................... 359/124 |
| 6,175,668 | B1 | | 1/2001 | Borrelli et al. ............... 385/11 |
| 6,201,629 | B1 | | 3/2001 | McClelland et al. ........ 359/223 |
| 6,212,151 | B1 | | 4/2001 | Heanue et al. ............... 369/112 |
| 6,227,724 | B1 | | 5/2001 | Verdiell ........................ 385/91 |
| 6,256,328 | B1 | | 7/2001 | Delfyett et al. ............... 372/23 |
| 6,275,315 | B1 | | 8/2001 | Park et al. ................... 359/153 |
| 6,275,317 | B1 | * | 8/2001 | Doerr et al. ................. 359/180 |
| 6,295,308 | B1 | | 9/2001 | Zah ............................. 372/50 |
| 6,316,764 | B2 | | 11/2001 | Heffner et al. ......... 250/227.11 |
| 6,327,063 | B1 | | 12/2001 | Rockwell .................... 359/172 |
| 6,350,064 | B2 | | 2/2002 | Mitsuda et al. ............... 385/88 |
| 6,352,376 | B2 | | 3/2002 | Walters et al. ................ 385/96 |
| 6,445,670 | B1 | | 9/2002 | Oshima ...................... 369/116 |
| 6,483,969 | B1 | | 11/2002 | Yap et al. ..................... 385/52 |
| 6,516,017 | B1 | | 2/2003 | Matsumoto ................... 372/50 |
| 6,522,793 | B1 | | 2/2003 | Szilagyi et al. .............. 564/433 |
| 2001/0017876 | A1 | | 8/2001 | Kner et al. .................... 372/50 |
| 2001/0036206 | A1 | | 11/2001 | Jerman et al. ................. 372/20 |
| 2001/0050928 | A1 | | 12/2001 | Cayrefourcq et al. ......... 372/12 |
| 2002/0064192 | A1 | | 5/2002 | Missey et al. ................. 372/20 |
| 2002/0076480 | A1 | | 6/2002 | Hsieh et al. .................... 427/8 |
| 2002/0085594 | A1 | * | 7/2002 | Pezeshki et al. .............. 372/20 |

OTHER PUBLICATIONS

Dellunde, Jaume, "Laser diodes", http://www.geocities.com/jdellund/receng.htm, printed Aug. 8, 2001 (4 pages).

Hunter, D.K., et al., "Guided wave optical switch architectures. Part 1. Space switching", International Journal of Optoelectronics, vol. 9, No. 6, 1994 (pp. 477–487).

Solgaard, O., et al., "Optoelectronic Packaging Using Silicon Surface–Micromachined Alignment Mirrors", IEEE Photonics Technology Letters, vol. 7, No. 1, 1995 (pp. 41–43) (4 pages total).

Li, G.P., et al., "16–Wavelength Gain–Coupled DFB Laser Array with Fine Tunability", IEEE Photonics Technology Letters, vol. 8, No. 1, Jan. 1996 (pp. 22–24).

Gordon, C., "Hybrid Mode–Locked DBR–laser", Multidisciplinary Optical Switching Technology Center, http://www.ece.ucsb.edu/MOST/33.html, (last updated Jan. 22, 1996), printed Aug. 5, 2001 (3 pages).

Daneman, M. J., et al., "Laser–to–Fiber Coupling Module Using a Micromachined Alignment Mirror", IEEE Photonics Technology Letters, vol. 8, No. 3, Mar. 1996 (pp. 396–398).

Wu, M., "Micromachining for Optical and Optoelectronic Systems", Proceedings of the IEEE, vol. 85, No. 11, Nov. 1997 (pp. 1833, 1943–1952).

Jacques, S., "Phase conjugate mirror and diffraction grating yield stable, collimated, coherent, high–power diode laser.", Oregon Medical Laser Center Newsletter, http://omlc.ogi.edu/news/dec97/pclaser.html, printed Apr. 9, 2001, (2 pages).

Shirasaki, M., "Chromatic–Dispersion Compensator Using Virtually Imaged Phased Array", IEEE Photonics Technology Letters, vol. 9, No. 12, Dec. 1997 (pp. 1598–1600).

Kudo, K., et al., "Multiwavelength microarray semiconductor lasers", Electronics Letters, vol. 34, No. 21, Oct. 15, 1998, (pp. 2037–2039).

Kopka, P., et al., "Bistable 2×2 and Multistable 1×4 Micromechanical Fibre–optic Switches on Silicon", Micro Opto Electro Mechanical Systems, MOEMS 1999 (4 pages).

Sahlén, O., "DWDM lasers fashion networks of the future", FibreSystems, Sep. 1999 (pp. 41–44).

"(BW)(OH–MARCONI–COMM–2) Marconi Communications Announces World–Beating Commercial Tuneable Laser at Telecom '99", Press Release, http://www.businesswire.com/cgi–bin/ts_headline.sh?/bw.101199/192842212, Oct. 11, 1999, printed Oct. 17, 2000 (2 pages).

Maluf, N., "Optical switches", An Introduction to Microelectromechanical Systems Engineering, 2000, pp. 187–190 (3 pages).

Nakano, H., "Technological Trends of Optical Communication Devices for DWDM", NEC Device Technology International 2000, No. 59 (5 pages).

Liu, F., et al., "Cost–effective wavelength selectable light source using DFB fibre laser array", Electronics Letters, vol. 36, No. 7, Mar. 30, 2000, pp. 620–621, (3 pages).

Hunwicks, A., "Advancing the Optical Component", http://www.telecoms–mag.com/issues/200004/tci/advancing-.html, Apr. 2000, printed Oct. 17, 2000 (6 pages).

Pezeshki, B., et al., "12nm tunable WDM source using an integrated laser array", Electronics Letters, vol. 36, No. 9, Apr. 27, 2000 (pp. 788–789).

Howe, P., "Light fantastic", digitalMASS at Boston.com, http://digitalmass.boston.com/news/daily/05/22/light_fantastic.html, printed Oct. 17, 2000 (5 pages).

Silverman, S., "Vcs beam big bucks at optics upstarts", Redherring.com, Oct. 9, 2000, http://www.redherring.com/vc/2000/1009/vc-optics100900.html?id=yahoo, printed Oct. 10, 2000 (5 pages).

International Search Report dated Jan. 21, 2003 for International Application No. PCT/US01/24969 and mailed Jan. 28, 2003 (3 pages).

International Search Report mailed Sep. 18, 2002 for International Application No. PCT/US02/10120 (2 pages).

* cited by examiner

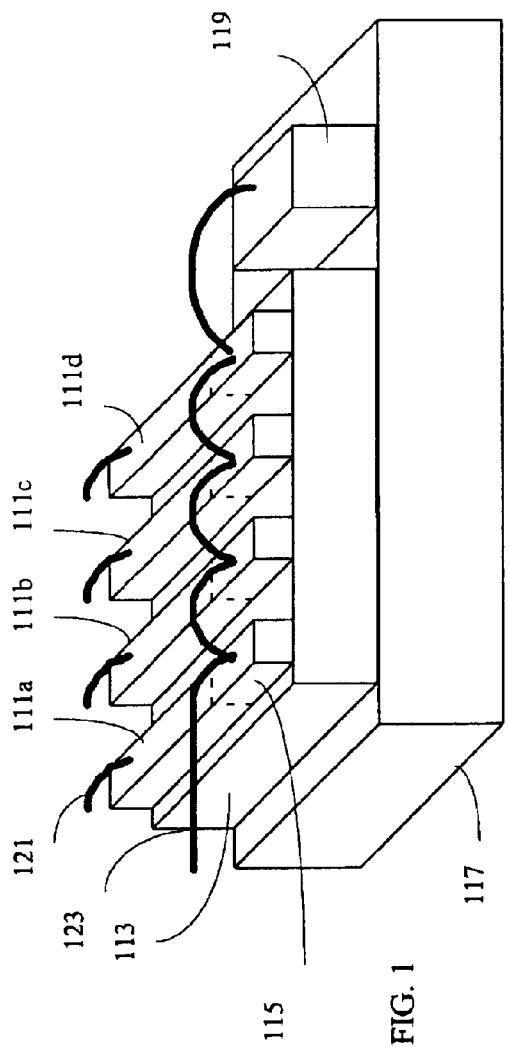
FIG. 1
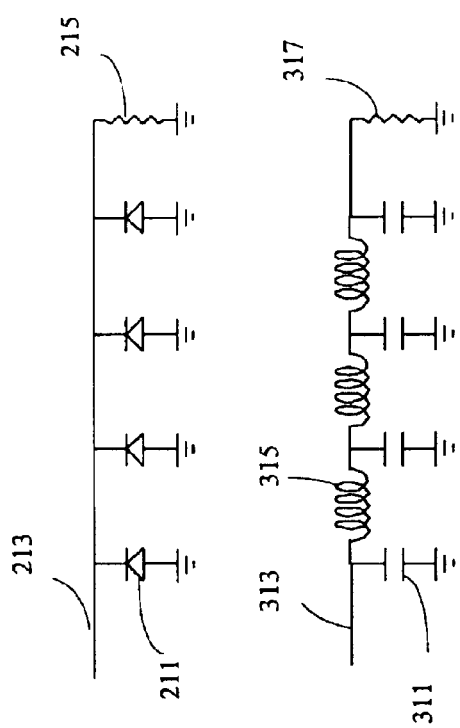
FIG. 2
FIG. 3

SWITCHED LASER ARRAY MODULATION WITH INTEGRAL ELECTROABSORPTION MODULATOR

CROSS-REFERENCE TO RELATED APPLICATIONS

This application claims the benefit of U.S. Provisional Application Ser. No. 60/280,093, entitled SWITCHED LASER ARRAY MODULATION WITH INTEGRAL ELECTROABSORBTION MODULATOR, filed Mar. 30, 2001, the disclosure of which is incorporated by reference.

BACKGROUND

The invention relates generally to photonic devices, and more particularly to laser arrays with commonly mounted electro-absorption modulators.

Lasers are often used in telecommunication devices to provide light. The light is generally modulated in some fashion to provide a data transport mechanism. A receiver receives the modulated light and provides the data to other units for processing. A transport media often used is fiber optic cabling. For some systems, such as Dense Wavelength Division Multiplexing (DWDM) system, light at a number of wavelengths is passed simultaneously through the transport media to increase data bandwidth.

The light is sometimes modulated by directly varying the laser current. However, in many applications modulation performed by directly varying laser output results in data signals with unsuitable waveforms when received at a receiver. This is often a result of parasitic FM modulation, or chirp, interacting with dispersion due to the fiber serving as a transport medium. Accordingly, in many instances the light is instead modulated by passing the light through a modulator, with the modulator varying the light in accordance with a data signal received by the modulator. These modulators are often separate units, which increases system cost. Moreover, individual modulators, such as electro-absorption modulators, may be better adapted to process light at a particular wavelength. As a DWDM system carries light at a number of wavelengths, the use of a common electro-absorption modulator may not provide optimal system performance for all the wavelength channels.

BRIEF SUMMARY OF THE INVENTION

The invention provides a photonic device incorporating an array of lasers with electro-absorption modulators on a common substrate.

These and other aspects of the invention will be more fully comprehended after study of this disclosure including the accompanying figures.

BRIEF DESCRIPTION OF THE DRAWINGS

FIG. 1 illustrates a laser array with electro-absorption modulators for each laser in the laser array;

FIG. 2 is a schematic of an equivalent circuit for the electro-absorption modulators of FIG. 1;

FIG. 3 is a schematic of a simplified equivalent circuit for the electro-absorption modulators of FIG. 1;

DESCRIPTION

Figure 4:
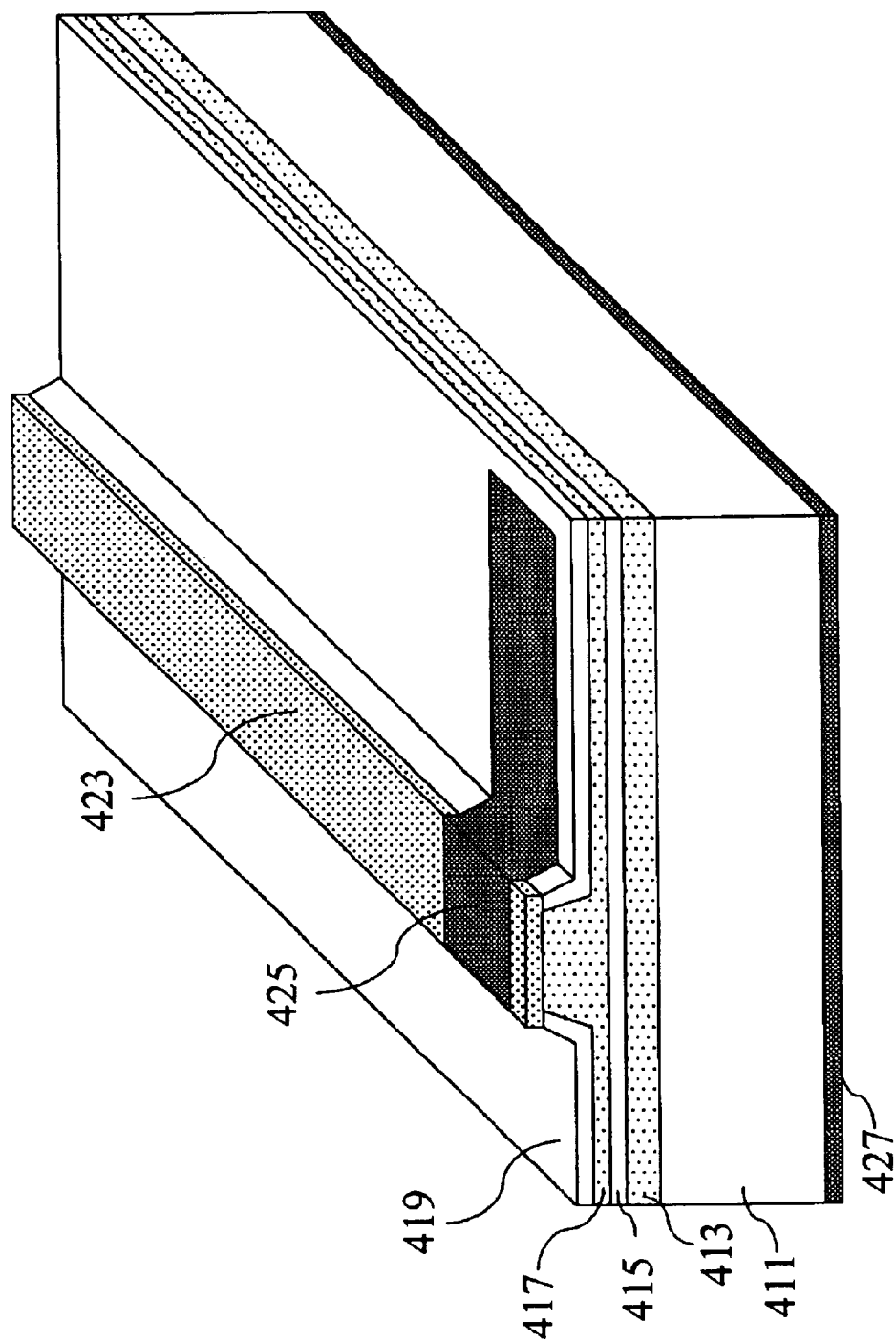
FIG. 4 illustrates an example laser of an array of lasers.

FIG. 1 illustrates a photonic device in accordance with aspects of the invention. The photonic device includes an array of lasers 111a–d. The lasers are formed on a common substrate 113. Each laser provides light, when the laser is activated, to a corresponding electro-absorption modulator. For example, laser 111a provides light to electro-absorption modulator 115. The lasers and electro-absorption modulators are formed on a common substrate 113. The common substrate is mounted on a submount 117.

Each of the lasers is provided a drive line, with, for example, laser 111a provided drive line 121. The drive line is used to activate, or forward bias the laser, causing the laser to lase. Light emitted from the laser is provided to the corresponding electro-absorption modulator. The electro-absorption modulators are provided a common high speed data signal by a data signal line 123, with the electro-absorption modulators coupled in parallel. Also coupled in parallel is a matching resistor 119, which is mounted on the submount.

In one embodiment, the lasers are spaced apart by approximately 10 microns, with the electro-absorption modulators having the same spacing for such a configuration of lasers. In one embodiment the electro-absorption modulators have a band gap appropriate for the output wavelength of the corresponding laser, which may vary from laser to laser in some applications. In other embodiments, however, the electro-absorption modulators have the same band gap.

In one embodiment of the device of FIG. 1 each of the lasers of the array of lasers emit light at different wavelengths. In operation for one embodiment a single laser, for example laser 111a, is turned on through application of a drive signal to drive line 121. A high speed data signal is applied to the data signal line, which supplies the data signal to all of the electro-absorption modulators. Thus, light from the single laser passes through one of the electro-absorption modulators, and the resulting light is modulated to include the data signal.

As light is passing through a single electro-absorption modulator, the remaining electro-absorption modulators need not receive the data signal. However, compared to lasers electro-absorption modulators are relatively small in size, approximately 100–200 microns in length. Electro-absorption are modulators are operated with reverse bias. Accordingly, electro-absorption modulators have a relatively small capacitance, which allows multiple electro-absorption modulators to receive high speed signals, such as the data signal. Moreover, providing the high speed data signal to all of the electro-absorption modulators removes the need for provision in the data signal line of a switch adapted for switching high speed signals.

Thus, in FIG. 2 a number of electro-absorption modulators 211 are coupled in parallel using line 213. Also coupled in parallel with the electro-absorption modulators is a matching resistor 215, provided for proper termination of the line. In some applications, the capacitance of all the electro-absorption modulators may be excessive for optimal operation. In such a circumstance, or in general, a lumped transmission line may be used. FIG. 3 shows a simplified equivalent circuit for a lumped transmission line version of FIG. 2. As shown in FIG. 3, a line 313, having lumped inductances 315, couples capacitances 311 in parallel. The capacitances are primarily provided by the electro-absorption modulators. The lumped inductances are provided between the electro-absorption modulators, partly formed of external inductors and partly formed by the inductance of wire bonds. Accordingly, in one embodiment the inductance between the electro-absorption modulators is matched to the capacitance of each electro-absorption modulator such that an effective continous transmission line is provided.

For an example system including twelve electro-absorption modulators having 0.5 pF capacitance, the total capacitance is approximately 6 pF. For a 50 ohm transmission line the resulting time constant is approximately 300 ps. Accordingly, in one embodiment the electro-absorption modulators are connected in series to form a lumped element transmission line. In order to match the impedance of a 50 ohm transmission line an inductance of approximately 6.25 nH is provided. In one embodiment the inductance is provided by using a wire of length of approximately 1 cm, with a normal aspect ratio between wire and ground. In another embodiment, however, an inductor is coupled to the drive line to provide the inductance, with in one embodiment the inductor being formed using a spiral inductor having an area of approximately 100 um sqaure. Such an inductor may be mounted on a semiconductor device forming the array of lasers, or approximate the semiconductor device.

FIG. 4 illustrates further details of a semiconductor waveguide laser such as may be used with the device of FIG. 1. The laser of FIG. 4 is a simple ridge waveguide laser, though in other embodiments buried hetero-structure, buried rib, or other types of lasers are used. The laser epitaxial layers are grown on an n-type InP substrate 411. A first layer of the laser is an n-type epitaxially grown InP lower cladding layer 413, then an undoped InGaAsP quaternary active layer 415 comprising a quantum well and barrier layers, and then a top p-type InP cladding layer 417. The top p-type InP cladding layer is etched in the shape of a ridge using conventional photolithography. For a DFB laser, the growth is interrupted midway and a grating is etched into the laser (not shown). After the ridge is etched, the wafer is coated with an insulating dielectric 419, such as silicon nitride, with the dielectric removed on top of the ridge. Metallization is applied to the top of the ridge, as shown by element 423. A second metallization step provides a contact regions 425, shown at the end of the stripe. The backside 427 of the substrate is also metallized to form an electrical contact. In operation, current flowing vertically through the laser, from the cladding layer 417 to the substrate contact 427, causes the laser to lase.

In general, electro-absorption modulators are formed using different epitaxial layers than the lasers. Accordingly, in one embodiment the electro-absorption modulators are formed by etching off laser layers and regrowing layers for the electro-absorption modulators. In another embodiment selective epitaxial growth techniques are used to vary the composition of the epitaxial layers, allowing for formation of the electro-absorption modulators on the laser chip. An example of a selective epitaxial growth technique is described in K. Kudo, IEEE Photonics Technology Letters vol. 10 (7), 1998, p. 929–931, the disclosure of which is incorporated by reference. For example, in one embodiment the quantum wells of the lasers and the electro-absorption modulator are fabricated in the same epitaxial step, but with a dielectric mask present on the wafer during the growth. The mask has wider regions around the laser opening than around the modulator opening, thus creating thicker quantum wells in the laser than in the modulator. The wider quantum wells of the laser cause the bandgap to be lower in energy than in the modulator, and thus the modulator would be largely transparent at the lasing wavelength with no reverse bias. As the voltage is increased, the bandgap of the modulator shrinks, and the absorption increases correspondingly to vary the output intensity.

Figure 5:
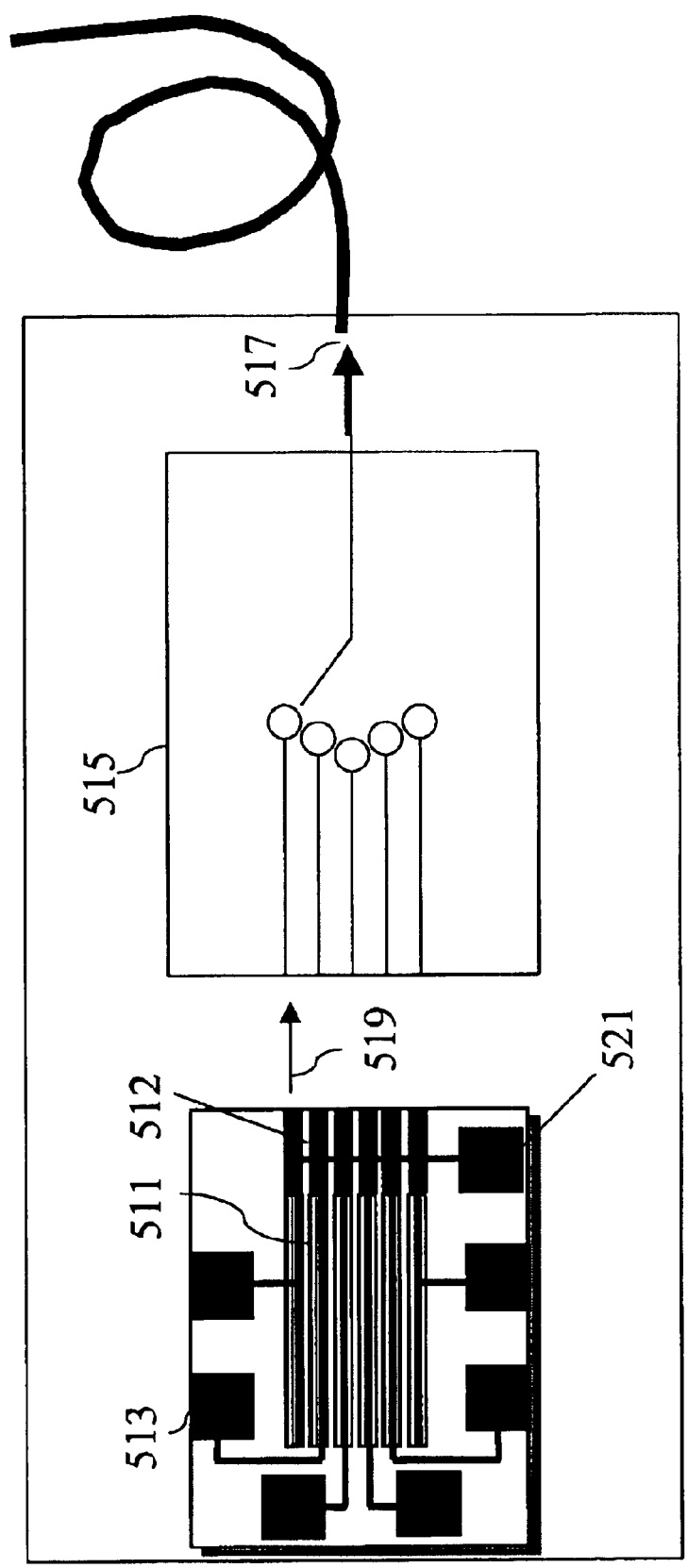
FIG. 5 illustrates a laser array with electro-absorption modulators with an optical switch coupling light from a selected laser to an optical output.

FIG. 5 illustrates a device using an array of combined lasers 511 and electro-absorption modulators 512, the array for example such as previously described. In the device of FIG. 5 the array of lasers is an array of single frequency lasers, such as distributed feedback (DFB) devices, on a semiconductor substrate. Each laser of the array of lasers is designed to operate at a different lasing wavelength. A number of techniques can be used to assign different wavelengths to each laser. These techniques include directly writing gratings with electron beam lithography, stepping a window mask during multiple holographic exposures, UV exposure through an appropriately fabricated phase mask, or changing the effective index of the mode of the lasers. Generally, for stable single mode characteristics, either a controlled phase shift is also included in the laser or gain/loss coupling is used in the grating. The wavelength of such lasers can be accurately controlled through dimensional variables, such as stripe width or layer thickness, and varied across the array.

Contact pads, such as contact pad 513, are provided for injecting current into each of the lasers of the array of lasers. A further contact pad 521 is provided for providing a high speed data signal to the electro-absorption modulators. Light emitted from a laser passes through a corresponding electro-absorption modulator and is directed to an optical switch 515. The optical switch directs light from a one of the lasers to an optical output, illustrated in FIG. 5 as an optical fiber 517.

A variety of devices may be used as the optical switch. For example, the optical switch may be a MicroElectrical-Mechanical System (MEMS) mirror, which is translatable or rotatable along one, two, or more axis to direct light to the optical fiber. A system including such a mirror may be such as described in U.S. patent application Ser. No. 10/000,142, filed Oct. 30, 2001, entitled Tunable Controlled Laser Array, the disclosure of which is incorporated by reference herein. Other switching devices, such as described in International Patent Publication No. WO 02/13343 A2, published Feb. 14, 2002, the disclosure of which is incorporated by reference, may be used in various embodiments.

In operation, when current is injected into a laser of the array of lasers using, for example, contact pad 513, the laser emits radiation with a specific wavelength, which passes through the corresponding electro-absorption modulator and emits from a particular position on the substrate, as represented by an arrow 519. In one embodiment, one laser is operated at a time, depending on the desired wavelength. Thus, as is described with respect to other figures, a switch may selectively provide a signal to a selected laser. The radiation or light from the lasers is transmitted to the optical switch. The optical switch has a number of states. In each particular state of a set of states, one of the input optical beams, i.e., light from one of the lasers, is transferred to the optical fiber.

Figure 6:
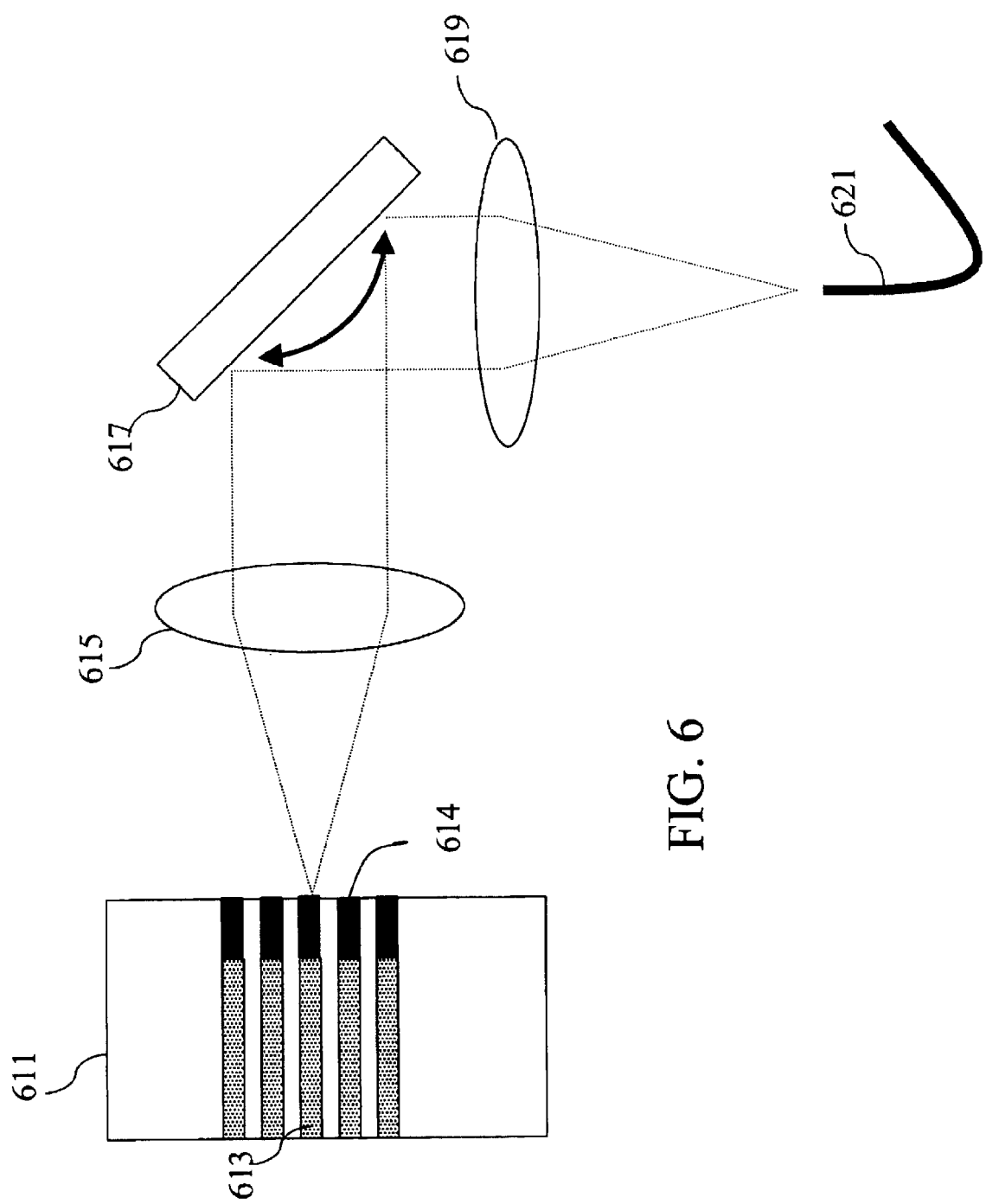
FIG. 6 is illustrates a device including a laser array with electro-absorption modulators with a MEMS mirror coupling light from a selected laser to an optical output.

FIG. 6 illustrates a system in accordance with the system of FIG. 5 wherein a MEMS mirror is used to direct light from an array to an optical output. In the system of FIG. 6 a semiconductor device 611 includes an array of lasers 613 and associated electro-absorption modulators 614. Light emitted from a selected one of the laser and associated electro-absorption modulators passes through a collimating lens 615. The collimated light strikes a tilt mirror, rotatable in one embodiment, which directs the light through a focusing lens and into an optical output. As illustrated, the optical output is an optical fiber.

As previously mentioned, at times driving an array of electro-absorption modulator with a single high speed data signal may present difficulties due to the capacitance of the electro-absorption modulators. This may be particularly the case when a device includes a relatively large number of lasers and associated electro-absorption modulators. Accordingly, in one embodiment lasers forming an array of lasers are assigned to a sub-group, with a particular device having several sub-groups. Each sub-group has a single electro-absorption modulator.

Figure 7:
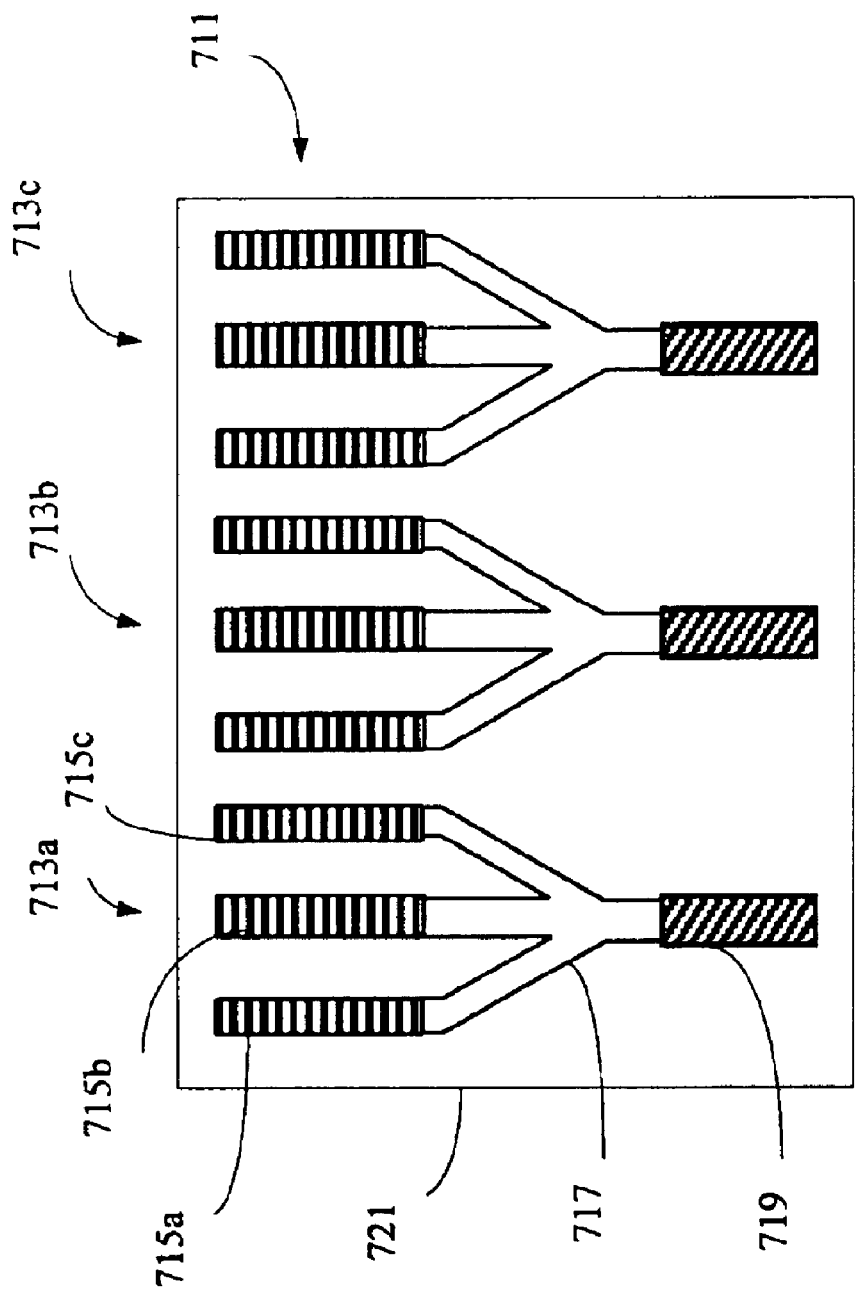
FIG. 7 is a semi-block diagram of a device including an array of lasers with the laser grouped into subgroups, with the subgroups having associated electro-absorption modulators.

Such a device is illustrated in FIG. 7. In the device of FIG. 7 an array of lasers 711 is formed on a substrate 721. As illustrated nine lasers are shown, although the number may vary. Each of the lasers are allocated to a sub-group, with some of the lasers in a first sub-group 713a, some of the lasers in a second sub-group 713b, and some of the lasers in a third sub-group 713c.

Taking the first sub-group as an example, the first sub-group includes three lasers 715a–c. The lasers 715a–c are coupled to a combiner 717, also on the substrate. Use of the combiner 717 results in a loss of light intensity, but the use of a combiner for each sub-group reduces the loss from the case where all of the lasers are configured to provide light to a single combiner.

The combiner 717 provides light from lasers in the first sub-group to an electro-absorption modulator 719, also on the substrate. Each of the combiners for the other sub-groups pass light to an electro-absorption modulator associated with each of the other sub-groups. Thus, the number of electro-absorption modulators, and capacitance associated therewith, is reduced.

The invention therefore provides a photonic device. Although the invention has been described with respect to certain embodiments, it should be recognized that the invention comprises the claims and their equivalents supported by this disclosure.

What is claimed is:

1. A photonic device comprising:
an array of lasers on a substrate, each of the lasers in the array of lasers provided a separate drive line; and an array of electro-absorption modulators on the substrate, each of the electro-absorption modulators receiving light emitted from a corresponding one of the laser in the array of lasers, the electro-absorption modulators receiving a common data signal from a data signal line; and wherein the data signal line couples the electro-absorption modulators in parallel, such that the common data signal drives all of the electro-absorption modulators; and
wherein the data signal line includes a matching resistor, the matching resistor serving to terminate a transmission line formed by the data signal line and associated elements.

2. The photonic device of claim 1 wherein the data signal line includes inductors between the electro-absorption modulators, whereby the inductance of the data signal line including inductors and capacitance provided by the electro-absorption modulators provides an effective lumped transmission line.

3. The photonic device of claim 2 wherein the inductors are spiral inductors mounted on a semiconductor device formed on the substrate.

4. A photonic device comprising:
an array of lasers on a substrate, each of the lasers in the array of lasers provided a separate drive line; and
an array of electro-absorption modulators on the substrate, each of the electro-absorption modulators receiving light emitted from a corresponding one of the lasers in the array of lasers, the electro-absorption modulators receiving a common data signal from a data signal line; and
further comprising an optical switch, the optical switch directing light emitted by a one of the lasers in the array of lasers and passed through a one of the electro-absorption modulators to an optical output path.

5. The photonic device of claim 4 wherein the optical switch comprises a moveable MEMS element.

6. The photonic device of claim 5 wherein the optical switch is a MEMS mirror.

7. The photonic device of claim 6 wherein spacing of the lasers in the array of lasers is on the order of 10 microns.

8. The photonic device of claim 7 wherein the lasers in the array of lasers each emit light at a different wavelength.

9. The photonic device of claim 4 wherein spacing of the lasers in the array of lasers is on the order of 10 microns.

10. The photonic device of claim 9 wherein the lasers in the array of lasers each emit light at a different wavelength.

11. A photonic device comprising:
an array of lasers on a substrate, each of the lasers in the array of lasers provided a separate drive line; and
an array of electro-absorption modulators on the substrate, each of the electro-absorption modulators receiving light emitted from a corresponding one of the lasers in the array of lasers, the electro-absorption modulators receiving a common data signal from a data signal line; and
wherein the bandgap of each electro-absorption modulator varies, with the bandgap varied as a function of the wavelength of light emitted from a laser associated with each electro-absorption modulater.

12. A semiconductor device for providing a modulated light signal from a closely packed laser array, the modulated signal being at a selectable wavelength, the semiconductor device comprising:
an array of lasers formed on a substrate, the lasers in the array of lasers each lasing at a different frequency, the lasers in the array of lasers being spaced approximately 10 microns apart;
an array of electro-absorption modulators formed on the substrate, each of the electro-absorption modulators being associated with a laser in the array of lasers, each electro-absorption modulator receiving light from their associated laser when the associated laser lases;
wherein the lasers have separate drive lines and the electro-absorption modulators have a common data signal line; and
wherein the substrate is mounted on a submount, and the common data signal line is coupled to a matching resistor mounted on the submount.

13. A photonic device comprising:
a plurality of lasers formed on a substrate;
a plurality of combiners, each of the combiners combining light from a number of different lasers of the plurality of lasers;
a plurality of electro-absorption modulators formed on the substrate, each of the electro-absorption modulators associated with and receiving light from a different combiner.

14. The photonic device of claim 13 wherein a data signal line couples the electro-absorption modulators in parallel, such that a data signal on the data signal line drives all of the electro-absorption modulators.

15. The photonic device of claim 14 wherein the data signal line includes a matching resistor, the matching resistor serving to terminate a transmission line formed by the data signal line and associated elements.

16. The photonic device of claim 15 wherein the data signal line includes inductors between the electro-absorption modulators, whereby the inductance of the data signal line including inductors and capacitance provided by the electro-absorption modulators provides an effective lumped transmission line.

17. The photonic device of claim 16 wherein the inductors are spiral inductors mounted on a semiconductor device formed on the substrate.

18. The photonic device of claim 13 further comprising an optical switch, the optical switch directing light emitted by a one of the lasers in the array of lasers and passed through a one of the electro-absorption modulators to an optical output path.

19. The photonic device of claim 18 wherein the optical switch comprises a moveable MEMS element.

20. The photonic device of claim 18 wherein spacing of the lasers in the array of lasers is on the order of 10 microns.

21. The photonic device of claim 20 wherein the lasers in the array of lasers each emit light at a different wavelength.

22. The photonic device of claim 21 wherein the bandgap of each electro-absorption modulator varies, with the bandgap varied as a function of the wavelength of light emitted from a laser associated with each electro-absorption modulater.

23. The photonic device of claim 13 wherein the lasers in the array of lasers form a plurality of sub-groups, with an electro-absorption modulator associated with each sub-group.

24. The photonic device of claim 23 further comprising a combiner for each sub-group, each combiner configured to combine light from the lasers in a sub-group and provide the light to the electro-absorption modulator associated with the sub-group.

25. The photonic device of claim 24 further comprising an optical switch, the optical switch directing light emitted by a one of the lasers in the array of lasers and passed through a one of the electro-absorption modulators to an optical output path.

26. The photonic device of claim 25 wherein the optical switch is a MEMS mirror.

27. The photonic device of claim 25 wherein the lasers in the array of lasers each emit light at a different wavelength.

* * * * *